United States Patent
Chen et al.

(10) Patent No.: US 11,791,559 B1
(45) Date of Patent: Oct. 17, 2023

(54) BROADBAND SOLAR CELL ANTENNA

(71) Applicant: Anhui University, Hefei (CN)

(72) Inventors: Qian Chen, Hefei (CN); Zilin Qiao, Hefei (CN); Juliang Lu, Hefei (CN); Songlin Yan, Hefei (CN); Jian Chen, Hefei (CN); Zhixiang Huang, Hefei (CN); Lixia Yang, Hefei (CN)

(73) Assignee: Anhui University, Hefei (CN)

( * ) Notice: Subject to any disclaimer, the term of this patent is extended or adjusted under 35 U.S.C. 154(b) by 0 days.

(21) Appl. No.: 18/297,664

(22) Filed: Apr. 10, 2023

(30) Foreign Application Priority Data

Jun. 13, 2022 (CN) .......................... 202210666741.8

(51) Int. Cl.
*H01Q 9/40* (2006.01)
*H01Q 5/50* (2015.01)
*H01Q 1/46* (2006.01)
*H01L 31/043* (2014.01)
*H01L 31/05* (2014.01)

(52) U.S. Cl.
CPC ............. *H01Q 9/40* (2013.01); *H01L 31/043* (2014.12); *H01Q 1/46* (2013.01); *H01Q 5/50* (2015.01); *H01L 31/05* (2013.01)

(58) Field of Classification Search
CPC ... H01Q 1/46; H01Q 5/50; H01Q 9/40; H01L 31/043; H01L 31/05
See application file for complete search history.

(56) References Cited

U.S. PATENT DOCUMENTS

| | | | |
|---|---|---|---|
| 5,666,127 A * | 9/1997 | Kochiyama | H01Q 1/288 343/DIG. 2 |
| 8,599,081 B2 | 12/2013 | Leung et al. | |
| 11,021,270 B2 * | 6/2021 | Honour | B64G 1/428 |
| 2006/0071858 A1 * | 4/2006 | Suh | H01Q 9/28 343/700 MS |
| 2012/0026067 A1 | 2/2012 | Parsche | |

(Continued)

FOREIGN PATENT DOCUMENTS

| CN | 103518290 A | 1/2014 |
|---|---|---|
| CN | 106848558 A | 6/2017 |

(Continued)

*Primary Examiner* — Graham P Smith
*Assistant Examiner* — Amal Patel
(74) *Attorney, Agent, or Firm* — True Shepherd LLC; Andrew C. Cheng (57) ABSTRACT

A broadband solar cell antenna includes a first solar cell layer, a first dielectric supporting layer, an antenna layer, a second dielectric supporting layer, and a second solar cell layer sequentially from top to bottom. The first and second solar cell layers are structurally identical; the first and second dielectric supporting layers are structurally identical; a monopole is a metal base copper-clad laminate in a shovel-shaped structure; a trumpet-shaped grounded coplanar waveguide (GCPW) feeding line is used; and a solar cell array forms a meta-surface structure. The broadband solar cell antenna has the features of broadband, miniaturization and low profile. The antenna layer is provided between the two solar cell layers. Solar cells on an upper surface and a back surface of the antenna can collect light in different angles. The antenna has desired radiation performance and can function as both an antenna and a solar cell.

9 Claims, 9 Drawing Sheets

(56) References Cited

U.S. PATENT DOCUMENTS

| | | | |
|---|---|---|---|
| 2013/0009851 A1* | 1/2013 | Danesh | ............... H01L 31/075 343/904 |
| 2017/0033247 A1 | 2/2017 | Sarabandi et al. | |
| 2018/0241124 A1* | 8/2018 | Jamaly | .................... H01Q 5/55 |

FOREIGN PATENT DOCUMENTS

| | | | | |
|---|---|---|---|---|
| CN | 110112545 A | | 8/2019 | |
| CN | 111326864 A | | 6/2020 | |
| CN | 113328244 A | * | 8/2021 | ............ H01Q 1/285 |
| CN | 114039194 A | | 2/2022 | |
| CN | 216624576 U | | 5/2022 | |
| DE | 102012204488 A1 | | 9/2013 | |
| JP | 2000165128 A | | 6/2000 | |

\* cited by examiner

BROADBAND SOLAR CELL ANTENNA

CROSS-REFERENCE TO RELATED APPLICATIONS

This application claims priority to Chinese Patent Application No. 202210666741.8 with a filing date of Jun. 13, 2022. The content of the application mentioned above, including any intervening amendments thereto, is incorporated herein by reference.

TECHNICAL FIELD

The present disclosure relates to the technical field of antennas and solar cells, particularly a broadband solar cell antenna.

BACKGROUND

As a kind of clean energy, the solar energy has become increasingly important under the impetus of energy crises. Products associated with solar cells are emerging constantly. The integration of the solar cell with an antenna allows the antenna system to use electrical energy generated by the solar cell. This provides a new idea for the power supply mode of the conventional antenna system. It is particularly applicable to remote areas without access to electricity. For the sake of common-caliber integration of the solar cell and the antenna, it is required to eliminate the adverse effect between the solar cell and the antenna. Existing solar cell antennas still cannot meet the requirements due to their narrow operating bandwidths.

Through long-term research and practices of the inventors, the broadband solar cell antenna is provided to overcome the above defect.

SUMMARY

An objective of the present disclosure is to provide a broadband solar cell antenna which eliminates an adverse effect between the solar cell and the antenna when they are integrated, and effectively extends an operating bandwidth of the antenna.

To achieve the above-mentioned objective, the present disclosure provides a broadband solar cell antenna. The broadband solar cell antenna includes a first solar cell layer, a first dielectric supporting layer, an antenna layer, a second dielectric supporting layer, and a second solar cell layer sequentially from top to bottom. The first and second solar cell layers are structurally identical. The first and second dielectric supporting layers are structurally identical. The antenna layer includes a monopole, a feeding line, a coupling line, and an antenna substrate. The first dielectric supporting layer includes a supporting foam dielectric plate. The monopole is a metal base copper-clad laminate in a shovel-shaped structure. The shovel-shaped structure comprises an elliptical region and a rectangular region. An elliptical unclad hole is defined in a center of the shovel-shaped structure. A semicircular unclad hole is defined in two sides of the shovel-shaped structure respectively. A bottom of the elliptical region of the monopole is connected to the feeding line. Both the feeding line and the monopole are located on an upper surface of the antenna substrate. The feeding line is a metal base copper-clad layer. The coupling line is provided at a lower side of the feeding line. The supporting foam dielectric plate of the first dielectric supporting layer and the supporting foam dielectric plate of the second dielectric supporting layer are respectively located on and under the antenna layer.

Preferably, the feeding line includes a feeding transmission line, an upper metal ground, and a back metal ground. The feeding transmission line is a multi-stage transformation structure. The upper metal ground includes two metal pieces that are left-right symmetric. The back metal ground is located on a back surface of the antenna substrate. The feeding transmission line is connected to the bottom of the elliptical region of the monopole. The feeding transmission line is located between the two metal pieces of the upper metal ground. The feeding transmission line, the two metal pieces and the back metal ground form a trumpet-shaped grounded coplanar waveguide (GCPW) feeding structure. A trumpet-shaped opening of the feeding structure faces the monopole.

Preferably, the feeding transmission line is provided with a multi-stage step having different line widths for impedance adjustment.

Preferably, the back metal ground of the feeding line is a rectangular metal piece. A side of the back metal ground, close to the monopole, is provided with a rectangular unclad region.

Preferably, the coupling line is U-shaped, and includes a coupling end and an isolating end. The coupling end is located close to an input end of the coplanar waveguide feeding line. The isolating end is located close to the monopole.

Preferably, the antenna layer is provided with a plurality of plated through holes (PTHs). The PTHs are distributed at two sides of each of the feeding line and the coupling line. The PTHs penetrate through the antenna substrate.

Preferably, the first solar cell layer includes a solar cell and a printed circuit board (PCB). The PCB is matched with the solar cell. The solar cell is placed on the PCB. A positive electrode and a negative electrode of the solar cell are arranged on a backlight surface and a light-receiving surface of the solar cell respectively. The positive electrode of the solar cell is contacted with a copper-clad portion of the PCB. The negative electrode of the solar cell is exposed. A power transmission line for transmitting electricity to the positive electrode of the solar cell is provided on an upper surface of the PCB.

Preferably, the solar cell includes a rectangular cell and a cell array comprising a plurality of rectangular grids distributed periodically. The rectangular cell is connected to the cell array.

Preferably, the first solar cell layer further includes a plurality of inductors and a metal line. The metal line includes a printed metal line and a non-printed metal line. The printed metal line is directly printed on the PCB. The non-printed metal line is provided at an edge of the PCB. The plurality of inductors includes a first inductor and a second inductor. Positive electrodes of the cell array and the rectangular cell are connected through the second inductor and the printed metal line, and negative electrodes of the cell array and the rectangular cell are connected through the first inductor and the non-printed metal line.

The present disclosure has the following beneficial effects over the prior art:

1. By employing the shovel-shaped monopole patch with an elliptical hole in the center and two semicircular holes at the two sides, the antenna has a smaller footprint. The antenna has a wider operating bandwidth due to the shovel-shaped monopole. The trumpet-shaped coplanar waveguide feeding line with multi-stage steps having different line widths for impedance adjustment further optimizes a matching state between the monopole and the feeding line, and reduces a return loss.

2. The solar cell array is arranged by nine two-dimensional (2D) rectangular grid cells to form a meta-surface structure, which further expands the operating bandwidth of the antenna under appropriate unit spacing.

3. With the patch printed structure, the broadband solar cell antenna has desired cascading in integration, is applied to cascaded production of radio-frequency (RF) circuits, and is highly applicable in engineering.

1—first solar cell layer, 11—rectangular cell, 12—cell array, 13—second inductor, 14—first inductor, 15—printed metal line, 16—non-printed metal line, 17—PCB, 2—first dielectric supporting layer, 21—supporting foam dielectric plate, 3—antenna layer, 31—monopole, 311—rectangular region, 312—elliptical region, 313—elliptical hole, 314—semicircular unclad holes, 32—feeding line, 321—feeding transmission line, 322—upper metal ground, 33—coupling line, 331—coupling end, 332—isolating end, 34—antenna substrate, 35—back metal ground, 36—PTH, 4—second dielectric supporting layer, and 5—second solar cell layer.

DETAILED DESCRIPTION OF THE EMBODIMENTS

The above and other technical features and advantages of the present disclosure will be described below in more details in combination with the accompanying drawings.

Figure 1:
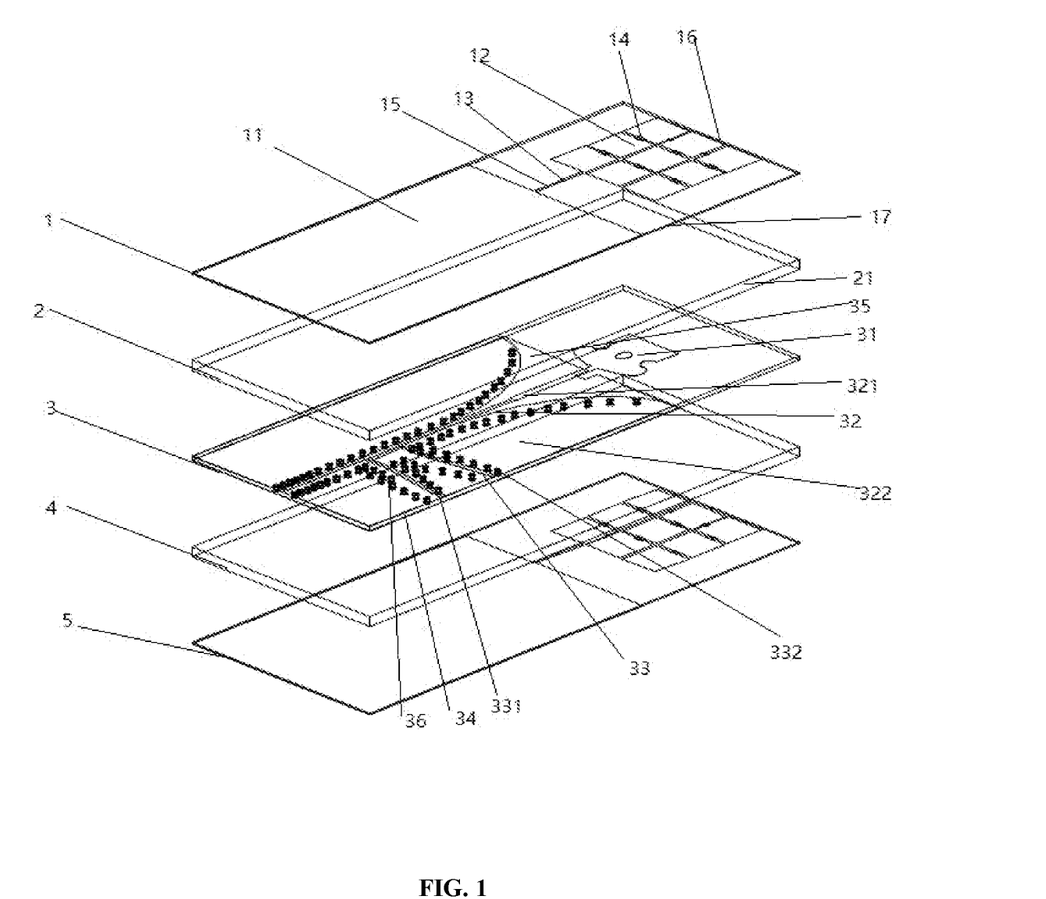
FIG. 1 is a perspective view of the broadband solar cell antenna.
Figure 2:
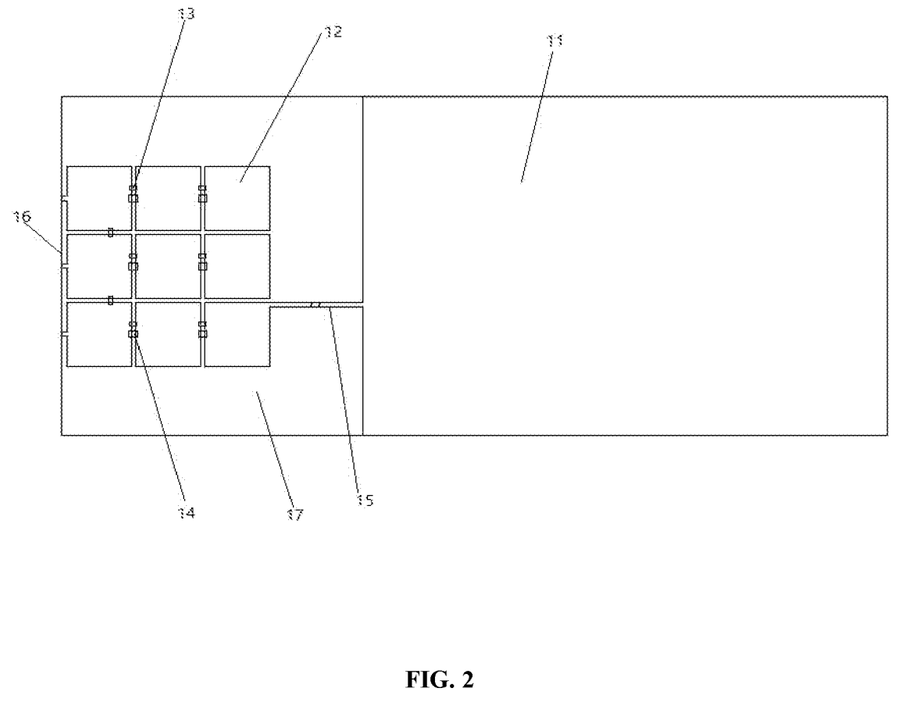
FIG. 2 is a top view of the broadband solar cell antenna.
Figure 3:
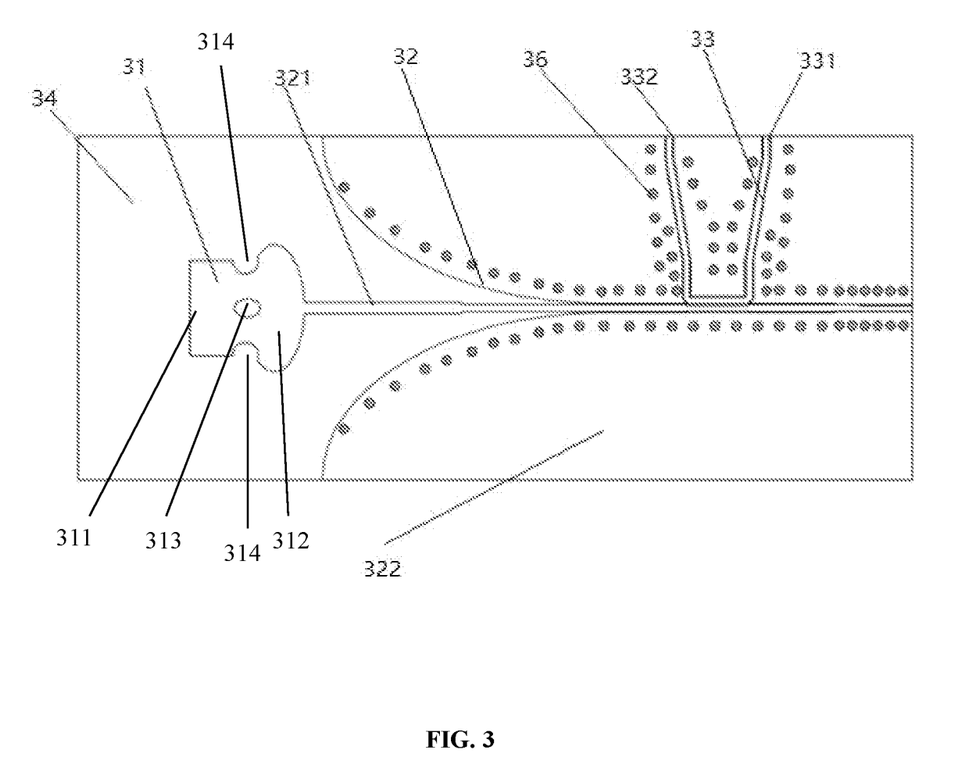
FIG. 3 is a top view of an antenna layer.
Figure 4:
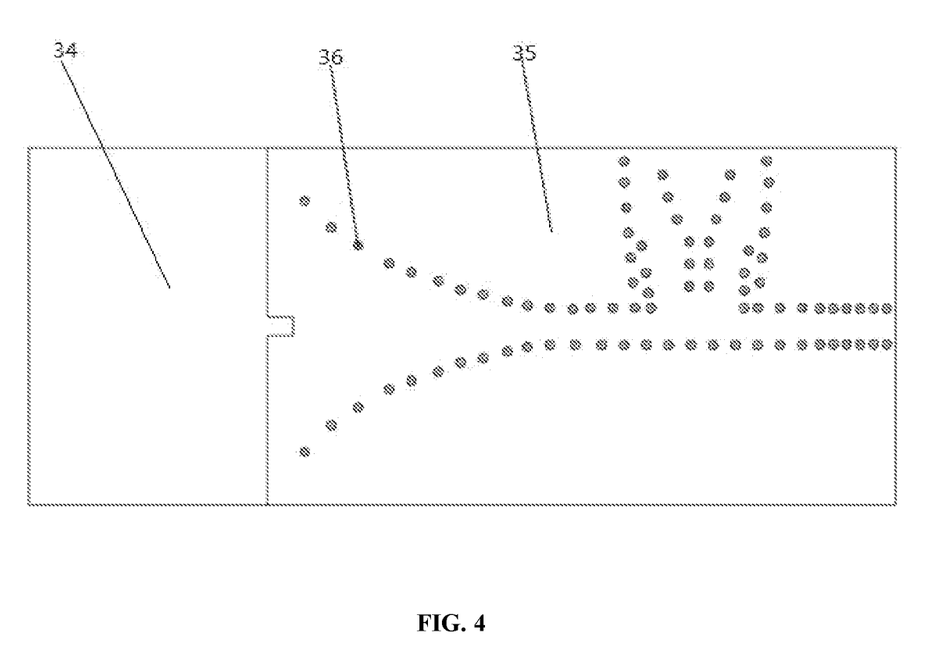
FIG. 4 is a bottom view of a back metal ground.

FIG. 1 is a perspective view of the broadband solar cell antenna. FIG. 2 is a top view of the broadband solar cell antenna. FIG. 3 is a top view of an antenna layer. FIG. 4 is a bottom view of a back metal ground.

The broadband solar cell antenna in the embodiment includes a first solar cell layer 1, a first dielectric supporting layer 2, an antenna layer 3, a second dielectric supporting layer 4, and a second solar cell layer 5 sequentially. The first solar cell layer 1 and the second solar cell layer 5 are structurally identical. The first dielectric supporting layer 2 and the second dielectric supporting layer 4 are structurally identical. The antenna layer 3 includes a monopole 31, a feeding line 32, a coupling line 33, and an antenna substrate 34.

As shown in FIG. 3, the monopole 31 is a metal base copper-clad laminate with a shovel-shaped structure which comprises a rectangular region 311 and an elliptical region 312. The rectangular region 311 is 20 mm in length, and 10 mm in width. The elliptical region 312 has a minor axis of 14.11 mm and a major axis of 29.52 mm. An elliptical hole 313 is defined in a center of the shovel-shaped structure to form an unclad region. The elliptical hole has a major axis of 6 mm and a minor axis of 4.3 mm. Two semicircular unclad holes 314 having a radius of 3 mm are symmetrically defined in two sides of the shovel-shaped structure.

As shown in FIG. 3, the feeding line 32 includes a feeding transmission line 321, an upper metal ground 322, and a back metal ground 35. The feeding transmission line 321 has a multi-stage transformation structure, and is configured for impedance adjustment. The upper metal ground 322 includes two metal pieces that are left-right symmetric. The feeding transmission line 321 is connected to a bottom of the elliptical region of the monopole 31. The feeding transmission line is located between the two metal pieces. The upper metal ground 322 is a combination of quarter-elliptical and rectangular metal pieces that are left-right symmetric. The ellipse has a major axis of 130 mm and a minor axis of 77.7 mm. The rectangular metal piece comprises a plurality of metal pieces having different widths, and is 72.67 mm long in total. The width of the rectangular metal piece changes with a gap between the feeding transmission line 321 and the upper metal ground 322. The rectangular metal piece is printed on an upper surface of the antenna substrate 34. The back metal ground 35 is a rectangular metal piece having a rectangular gap. The rectangular gap is 5.75 mm wide, and 4.29 mm long. The rectangular metal piece is 140.97 mm in length, and 80 mm in width. The back metal ground 35 is printed on a back surface of the antenna substrate 34. The antenna substrate 34 is 1.5 mm in thickness, so as to realize desired impedance matching, and reduce the return loss. As shown in FIG. 3, the coupling line 33 has a line spacing of 0.4 mm and a line width of 1.5 mm, and is spaced apart from the upper metal ground 322 and the back metal ground 35 by 0.26 mm. The feeding transmission line 321 has the multi-stage transformation structure, and has widths of 1.25 mm, 1.5 mm, 1.4 mm, 1.6 mm and 2.5 mm sequentially from right to left. Gaps between the feeding transmission line and the rectangular portion of the upper metal ground 322 change with the widths which are 0.25 mm, 0.2 mm, 0.35 mm, 0.35 mm, 0.35 mm and 0.35 mm sequentially from right to left.

The coupling line 33 is connected to a lower side of the feeding line 32. As shown in FIG. 3, an end of the coupling line close to an input end of the feeding line 32 serves as a coupling end 331. An end of the coupling line close to the monopole 31 serves as an isolating end 332. After the monopole 31 is integrated with the circuit, the coupling end 331 may be used to test an output of the circuit, and the isolating end 332 may be used to test characteristic parameters of the antenna.

As shown in FIG. 3, the coupling line 33 has a line spacing of 0.4 mm and a line width of 1.5 mm. The coupling line 33 is spaced apart from the upper metal ground 322 and the back metal ground by 0.26 mm.

PTHs 36 have a hollow design with an inner radius of 0.41 mm and an outer radius of 1.02 mm. Hollow copper probes are generally used by the PCB process. The PTHs 36 penetrate through the antenna substrate 34, are connected to the upper metal ground 322 and the back metal ground 35, and are distributed at two sides of each of the feeding line 32 and the coupling line 33. The PTHs are arranged irregularly, so as to reduce interference of an external signal on a transmission signal in RF transmission and prevent a microstrip line from affecting performance of the antenna.

As shown in FIG. 2, a metal copper-clad pattern having same size and arrangement as the solar cell is printed on an upper surface of the PCB 17. The metal copper-clad pattern on the PCB 17 is equivalent to projection of the solar cell. The metal pattern facilitates location of the solar cell, and connection of the back electrode. The PCB 17 is matched with the solar cell. The solar cell is placed on the PCB 17. A positive electrode of the solar cell is contacted with a copper-clad portion of the PCB 17. A negative electrode of the solar cell is exposed.

The PCB 17 is 0.5 mm in thickness, and is made of the Flame Retardant 4 dielectric material. The supporting foam dielectric plate 21 takes a supporting effect, is 3.5 mm thick, and is made of a foam material with a low dielectric constant (close to a dielectric constant of air).

As shown in FIG. 2, the solar cell includes a rectangular cell and a cell array comprising a plurality of 2D rectangular grids distributed periodically. The rectangular cell is 123.67 mm in length, and 80 mm in width. Small rectangular cells in the cell array are 14.2 mm in length, and 14 mm in width.

As shown in FIG. 2, the first solar cell layer 1 further includes a plurality of inductors and a metal line. There are 15 inductors in total, including 14 inductors at intersections between the small cells in the cell array 12, and one inductor at a junction between the rectangular cell 11 and the cell array 12. The plurality of inductors comprises a first inductor 14 with a length of 1 mm and a width of 0.5 mm, and a second inductor 13 with a length of 1.65 mm and a width of 0.8 mm. The second inductor 13 is directly welded on the copper-clad portion of the PCB. The first inductor 14 is welded on an electrode of the cell array 12. At the intersections between the small cells in the cell array 12 in FIG. 2, the larger inductor is the first inductor, and the smaller inductor has is the second inductor. All inductors have an inductance of 47 nH. The cell array 12 has a lateral clearance of 0.35 mm, and a longitudinal clearance of 0.5 mm. With the cell array 12, the antenna achieves better performance and a wider band.

As shown in FIG. 2, positive electrodes of the cell array and the rectangular cell are connected through a printed metal line 15 and the second inductor 13. Compared with direct connection through the metal line, the connection through the inductor can reduce influences on radiation performance of the antenna. Negative electrodes of the cell array 12 and the rectangular cell 11 are connected through three external non-printed metal lines 16. For the small cells in the cell array 12, negative electrodes are connected through the first inductor 14, and positive electrodes are connected through the second inductor 13.

Figure 5:
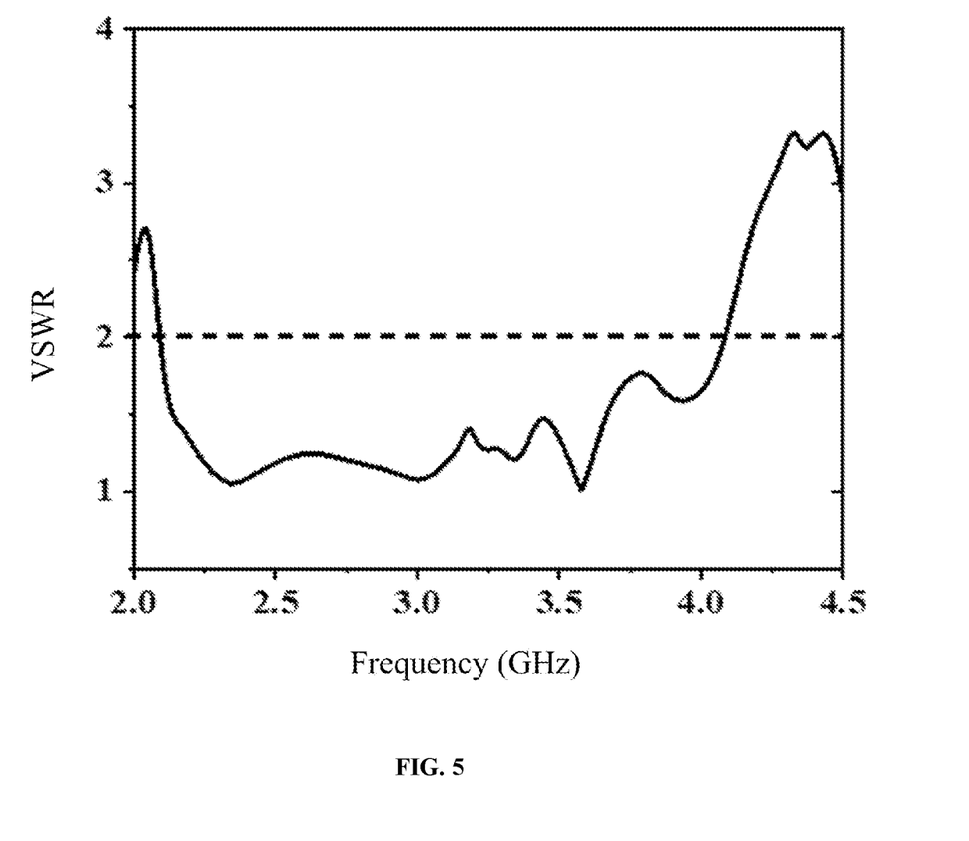
FIG. 5 illustrates a curve of a voltage standing wave ratio (VSWR)

FIG. 5 illustrates a VSWR of the broadband solar cell antenna.

Figure 6:
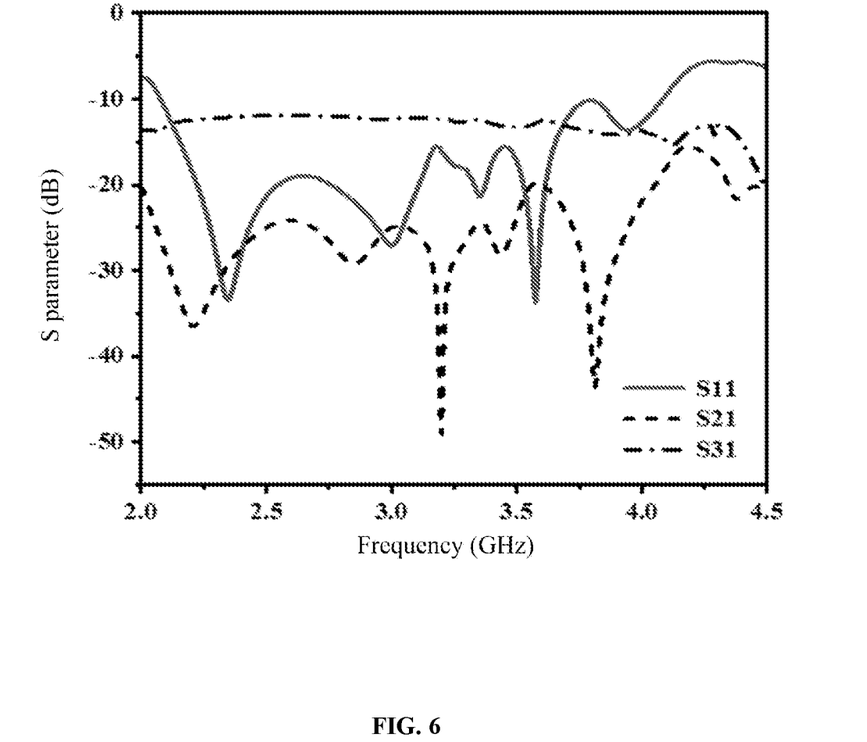
FIG. 6 illustrates a comparison between S11, S21 and S31 curves of the broadband solar cell antenna.
Figure 7:
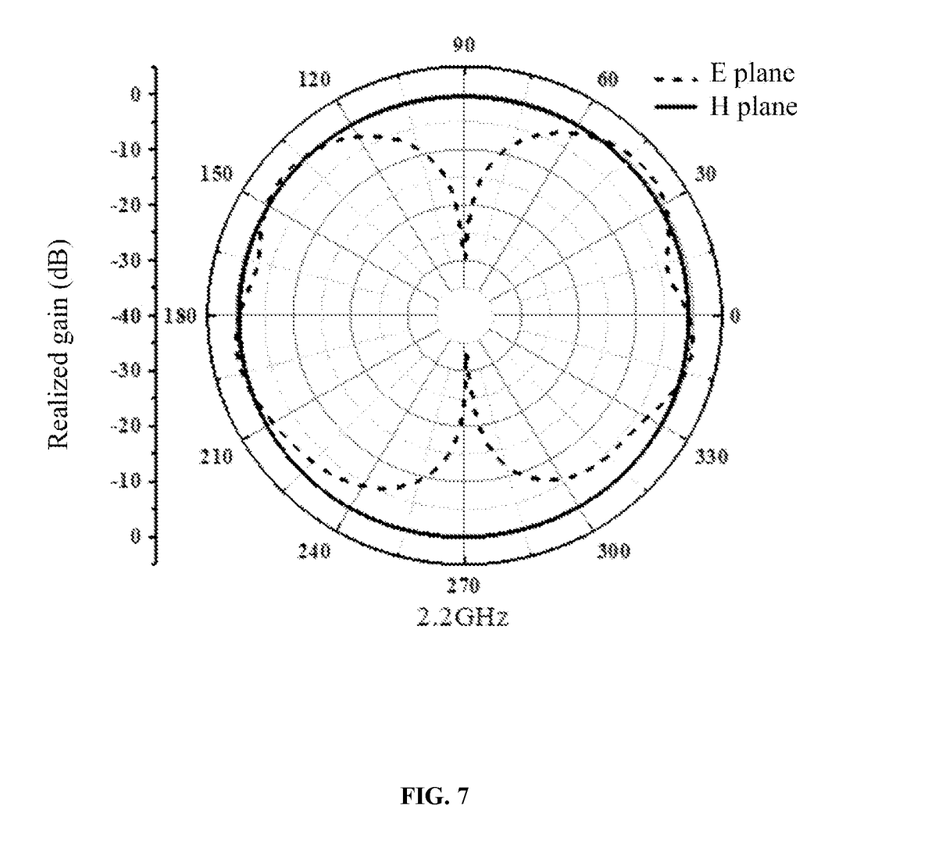
FIG. 7 illustrates a directivity pattern of the broadband solar cell antenna on an E plane and an H plane at 2.2 GHz.
Figure 8:
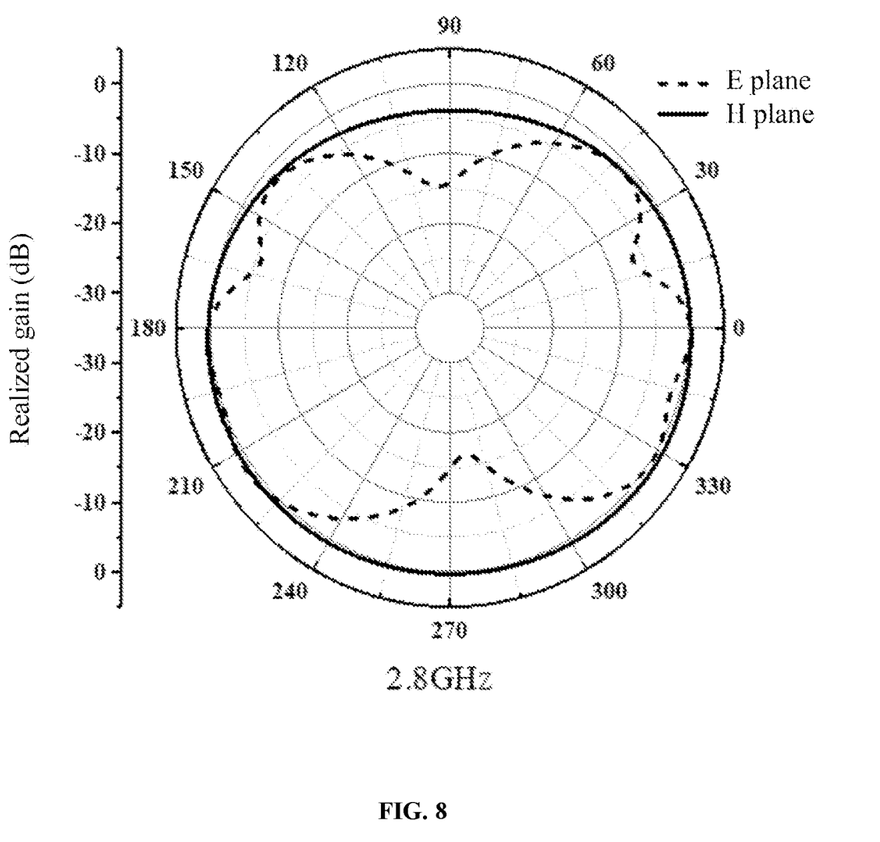
FIG. 8 illustrates a directivity pattern of the broadband solar cell antenna on an E plane and an H plane at 2.8 GHz.
Figure 9:
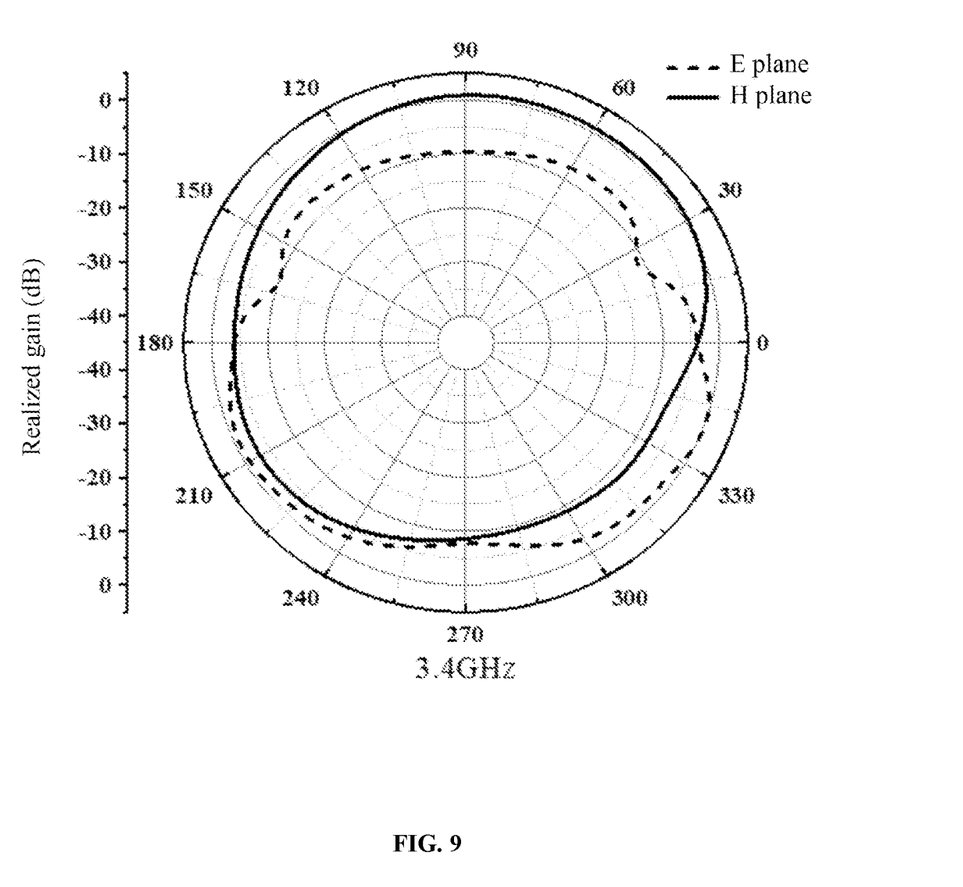
FIG. 9 illustrates a directivity pattern of the broadband solar cell antenna on an E plane and an H plane at 3.4 GHz.

FIG. 6 illustrates a comparison of S parameters between two ends of a coupling line 33 and an input end of a feeding line 32. The input end is the port 1, the isolating end is the port 2, and the coupling end is the port 3. FIG. 7 illustrates a directivity pattern of a broadband solar cell antenna on an E (xoz) plane and an H (yoz) plane at 2.2 GHz. FIG. 8 illustrates a directivity pattern of a broadband solar cell antenna on an E plane and an H plane at 2.8 GHz. FIG. 9 illustrates a directivity pattern of a broadband solar cell antenna on an E plane and an H plane at 3.4 GHz. As shown in FIG. 5, when the VSWR is less than 2, the broadband solar cell antenna has a band of 2.09-4.08 GHz, and the relative bandwidth is 64.5%. For the directivity pattern on the E plane, low-frequency points within the band are "transverse 8-shaped", while high-frequency points are omnidirectional. On the H plane, all points are omnidirectional.

The present disclosure equilibrates performance of the antenna and the solar cell desirably. With cut arrays of the solar cell panel on the upper surface and back surface of the antenna, the solar cell panel is completely exposed in the sunlight and is not shielded. While performing photovoltaic conversion, the upper surface and back surface of the antenna form a meta-surface structure, thereby extending the band. When the antenna and the circuit board are cascaded, the "U-shaped" coupling line can be used to test the output signal of the circuit or test the performance of the antenna through the input signal.

The above described are merely preferred embodiments of the present disclosure, and are merely illustrative rather than restrictive. It is to be understood that many alterations, modifications or even equivalent replacements can be made within the spirit and scope defined by the claims of the present disclosure, and should fall within the protection scope of the present disclosure.

What is claimed is:

1. A broadband solar cell antenna, comprising a first solar cell layer, a first dielectric supporting layer, an antenna layer, a second dielectric supporting layer, and a second solar cell layer sequentially from top to bottom, wherein
    the first and second solar cell layers are structurally identical;
    the first and second dielectric supporting layers are structurally identical;
    the antenna layer comprises a monopole, a feeding line, a coupling line, and an antenna substrate;
    the first dielectric supporting layer comprises a supporting foam dielectric plate;
    the monopole is a metal base copper-clad laminate with a shovel-shaped structure; the shovel-shaped structure comprises an elliptical region and a rectangular region; an elliptical unclad hole is defined in a center of the shovel-shaped structure; a semicircular unclad hole is defined in two sides of the shovel-shaped structure respectively;
    a bottom of the elliptical region of the monopole is connected to the feeding line; both the feeding line and the monopole are located on an upper surface of the antenna substrate;
    the feeding line is a metal base copper-clad layer;
    the coupling line is arranged at a lower side of the feeding line;
    the supporting foam dielectric plate of the first dielectric supporting layer and the supporting foam dielectric plate of the second dielectric supporting layer are respectively located on and under the antenna layer.

2. The broadband solar cell antenna according to claim 1, wherein the feeding line comprises a feeding transmission line, an upper metal ground, and a back metal ground; the feeding transmission line has a multi-stage transformation structure; the upper metal ground comprises two metal pieces that are left-right symmetric; the back metal ground is located on a back surface of the antenna substrate; the feeding transmission line is connected to the bottom of the elliptical region of the monopole; the feeding transmission line is located between the two metal pieces of the upper metal ground; the feeding transmission line, the two metal pieces, and the back metal ground form a trumpet-shaped grounded coplanar waveguide (GCPW) feeding structure; and a trumpet-shaped opening of the feeding structure faces the monopole.

3. The broadband solar cell antenna according to claim 2, wherein an end of the feeding transmission line, close to the monopole, is provided with multi-stage steps having different line widths for impedance adjustment.

4. The broadband solar cell antenna according to claim 1, wherein the back metal ground of the feeding line is a rectangular metal piece, and a side of the back metal ground, close to the monopole, is provided with a rectangular unclad region.

5. The broadband solar cell antenna according to claim 1, wherein the coupling line is U-shaped, and comprises a coupling end and an isolating end, the coupling end is located close to an input end of the feeding line, and the isolating end is located close to the monopole.

6. The broadband solar cell antenna according to claim 1, wherein the antenna layer is provided with a plurality of plated through holes (PTHs), the PTHs are distributed at two sides of each of the feeding line and the coupling line, and the PTHs penetrate through the antenna substrate.

7. The broadband solar cell antenna according to claim 1, wherein the first solar cell layer comprises a solar cell and a printed circuit board (PCB); the PCB is matched with the solar cell; the solar cell is placed on the PCB; a positive electrode and a negative electrode of the solar cell are respectively arranged on a backlight surface and a light-receiving surface of the solar cell; the positive electrode of the solar cell is contacted with a copper-clad portion of the PCB; the negative electrode of the solar cell is exposed; and a power transmission line for transmitting electricity to the positive electrode of the solar cell is arranged on an upper surface of the PCB.

8. The broadband solar cell antenna according to claim 7, wherein the solar cell comprises a rectangular cell and a cell array comprising a plurality of rectangular grids distributed periodically, and the rectangular cell is connected to the cell array.

9. The broadband solar cell antenna according to claim 8, wherein the first solar cell layer further comprises a plurality of inductors and a metal line; the metal line comprises a printed metal line and a non-printed metal line; the printed metal line is directly printed on the PCB; the non-printed metal line is provided at an edge of the PCB; the plurality of inductors comprise a first inductor and a second inductor; and positive electrodes of the cell array and the rectangular cell are connected through the second inductor and the printed metal line, and negative electrodes of the cell array and the rectangular cell are connected through the first inductor and the non-printed metal line.

\* \* \* \* \*